(12) United States Patent
Lai et al.

(10) Patent No.: US 7,233,609 B2
(45) Date of Patent: Jun. 19, 2007

(54) METHOD AND RELATED APPARATUS FOR FEEDBACK CONTROL OF LASER POWER OF OPTICAL DISK DRIVE

(75) Inventors: Yi-Lin Lai, Taipei Hsien (TW); Chin-Yin Tsai, Taipei Hsien (TW); Hung-Chang Chen, Taipei Hsien (TW)

(73) Assignee: Via Technologies Inc., Hsin-Tien, Taipei Hsien (TW)

( * ) Notice: Subject to any disclaimer, the term of this patent is extended or adjusted under 35 U.S.C. 154(b) by 524 days.

(21) Appl. No.: 10/707,320

(22) Filed: Dec. 4, 2003

(65) Prior Publication Data
US 2004/0125836 A1   Jul. 1, 2004

(30) Foreign Application Priority Data
Dec. 5, 2002   (TW) ............................... 91135337 A

(51) Int. Cl.
*H01S 3/13* (2006.01)
*H01S 3/00* (2006.01)

(52) U.S. Cl. ............................ 372/38.07; 372/29.021; 372/38.02

(58) Field of Classification Search ............. 372/38.07
See application file for complete search history.

(56) References Cited

U.S. PATENT DOCUMENTS 4,967,417 A   10/1990   Yamada
2004/0202216 A1*  10/2004  Fairgrieve ............... 372/38.07

* cited by examiner

*Primary Examiner*—Armando Rodriguez
(74) *Attorney, Agent, or Firm*—Winston Hsu

(57) ABSTRACT

A method and related apparatus for feedback control of laser power provided by a pick-up head of an optical disk drive. The pick-up head can adjust a cross-voltage of a laser generator according to a signal level of a control signal such that the laser power is changed correspondingly. The method includes updating the signal level of the control signal according to feedback of the cross-voltage or the control signal, such that the laser power is adjusted accordingly.

17 Claims, 5 Drawing Sheets

METHOD AND RELATED APPARATUS FOR FEEDBACK CONTROL OF LASER POWER OF OPTICAL DISK DRIVE

BACKGROUND OF INVENTION

1. Field of the Invention

The present invention relates to a method and related apparatus for controlling a pickup head of an optical disk drive in a feedback manner, and more particularly, to a method and related apparatus for controlling the powers of laser beams emitted by the pickup head in the feedback manner according to a cross-voltage of a laser diode or a laser control signal.

2. Description of the Prior Art

The advantages of light weight, low cost, easy to store, and great data-storing capacity have made an optical disk a most important non-volatile memory media in modern information ages. Data stored in an optical disk is read by an optical disk drive and designing an optical disk drive of good data-reading capability is becoming a popular concern for the information industry.

Please refer to FIG. 1, which is a function block diagram of an optical disk drive 10 according to the prior art. The optical disk drive 10 comprises a motor 14 for rotating a disk 12, a pickup head 16, a control circuit 18, and a processor 20 for controlling functionalities of the optical disk drive 10. The optical disk drive 10 emits laser beams onto the disk 12 with the pickup head 16 and reads data of the disk 12 according laser beams reflected by the disk 12. The control circuit 18 is a pre-amplifier capable of controlling powers of laser beams emitted by the pickup head 16. A laser diode 24, installed in the pickup head 16 as a laser generator, generates the laser beams to project onto the disk 12. A power-adjusting circuit 22 is used to adjust a cross-voltage V between two ends of the laser diode 24 at nodes Np1, Np2. As the cross-voltage V is changed, the powers of laser beams emitted by the laser diode 24 change accordingly. A reference signal end 17A, a cross-voltage output end 17B and a control end 17C are installed in the pickup head 16 for controlling powers of laser beams emitted from the pickup head 16. The power-adjusting circuit 22 receives a control signal 38 transmitted from the control end 17C and adjusts the cross-voltage V according to the voltage level of the control signal 38. A voltage level of the cross-voltage V at node Np1 is determined by a bias voltage 34A output from the reference voltage end 17A. Since the cross-voltage V is controlled by the power-adjusting circuit 22, a voltage level of the cross-voltage V at node Np2 is equivalently determined by the power-adjusting circuit 22. The pickup head 16 outputs a voltage at f3 node Np2 as an output voltage 34B at the cross-voltage output end 17B.

The control signal 38 to control the power-adjusting circuit 22 is generated by the control circuit 18. The control circuit 22 comprises two sub-controllers 26A and 26B, a digital-to-analog converter (DAC) 30, a differential amplifier 32, and three transmission circuits 28A, 28B and 28C. The sub-controller 26A generates a first signal 36A. The processor generates a digital second signal 36B. The digital second signal 36B will be transformed into an analog second signal 36C by the DAC 30 and transmitted to the differential amplifier 32 by the transmission circuit 28C. After respectively receiving the first signal 36A and the analog second signal 36C with a pair of differential-formed input ends (indicated by labels "+" and "−" in FIG. 1), the differential amplifier 32 generates the control signal 38 according to a difference between the first signal 36A and the analog second signal 36C and transmits the control signal 38 to the control end 17C of the pickup head 16 through the transmission circuit 28B. The sub-controller 26B generates the bias voltage 34A. The transmission circuit 28A is used to receive the output voltage 34B output from the cross-voltage output end 17B.

The processor 20 controlling powers of laser beams emitted by the pickup head 16 with the control circuit 18 is described as follows. The control circuit 18 generates the bias voltage 34A, whose voltage level is constant, with the sub-controller 26B to control a voltage level of the pickup head 16 at node Np1 and to keep the voltage level at node Np1 constant. The first signal 36A generated by the sub-controller 26A is also constant. The processor 20 changes the second signal 36B input to the DAC 30 and changes the analog second signal 36C accordingly. Therefore, the control signal 38, which is generated by the differential amplifier 32 according to the difference between the first signal 36A and second signal 36C, is changed according to the variation of the second signal 36C. As the control signal 38 is changed, the power-adjusting circuit 22 adjusts the cross-voltage V accordingly and changes the powers of laser beams emitted by the laser diode 24. In other words, the processor 20 is capable of controlling the power-adjusting circuit 22 to adjust the cross-voltage V and of further controlling the powers of laser beams emitted by the laser diode 24 with the second signal 36B and the control signal 38. Since the bias voltage 34A is constant, the variation of the output voltage 34B reflects the variation of the cross-voltage V.

In the prior art, the processor 20 stabilizes the powers of laser beams emitted from the pickup head 16 by setting the second signal 36B at a constant voltage level. However, the stabilization suffers from a mass production of the control circuit 18. That is, control signals, as well as bias voltages, generated by control circuits in one type are different from each other even if the second signal 36B generated by the processor 20 is kept constant. In addition, the pickup head 16 suffers from the stabilization problem too. Characteristics of the power-adjusting circuits and laser diodes in a pickup head are different from each other even if these devices are of one type. That is, powers of laser beams emitted by different but same type pickup heads are different even if the voltage level of control signal 38 and of the bias voltage 34A are constant. The above-mentioned problem becomes more and more serious as the control circuit 18 and the pickup head 16 combine to function, with the powers of laser beams emitted by the pickup head 16 becoming dramatically unstable. Practically, a laser output power is ideally about 700 μW, but, in reality, the laser output power will raise to as high as 1,400 μW due to a drifting effect caused by the combination of the pickup head and control circuit. As known by those skilled in the art, the optical disk drive 10 not only reads data of the disk 12 according to the laser beams reflected by the disk 12, but controls functions of track-searching, track-locking and pickup head-positioning in a feedback manner according to the reflected laser beams. If the powers of laser beams emitted by the pickup head 16 are extremely high, the powers of laser beams reflected from the disk 12 will raise accordingly. The high power-leveled laser beams will drive transistors of the control circuit 18 to work in borders of a normal-working range, thus distorting signals and malfunctioning the feedback control. On the contrary, if the powers of laser beams emitted by the pickup head 16 are extremely low, too low a power being vulnerable to noise, the optical disk drive 10 cannot function normally either.

SUMMARY OF INVENTION

The claimed invention provides a method and related apparatus to control powers of laser beams emitted by a pickup head in a feedback manner to solve the above-mentioned problems.

In the prior art, because the drifting effect of the control circuit can not compensate for that of the pickup head, the control circuit combines with the pickup head and shifts the laser output power to a power level away from the ideal range and malfunctions the optical disk drive.

In the claimed invention, a processor adjusts the control signal in the feedback manner with the cross-voltage of the laser diode or the control signal of the power-adjusting circuit and keeps the laser output power at a power level within the ideal range and keeps the optical disk drive working normally.

The claimed invention will no doubt become obvious to those of ordinary skill in the art after reading the following detailed description of the preferred embodiment that is illustrated in the various figures and drawings.

DETAILED DESCRIPTION

Figure 1:
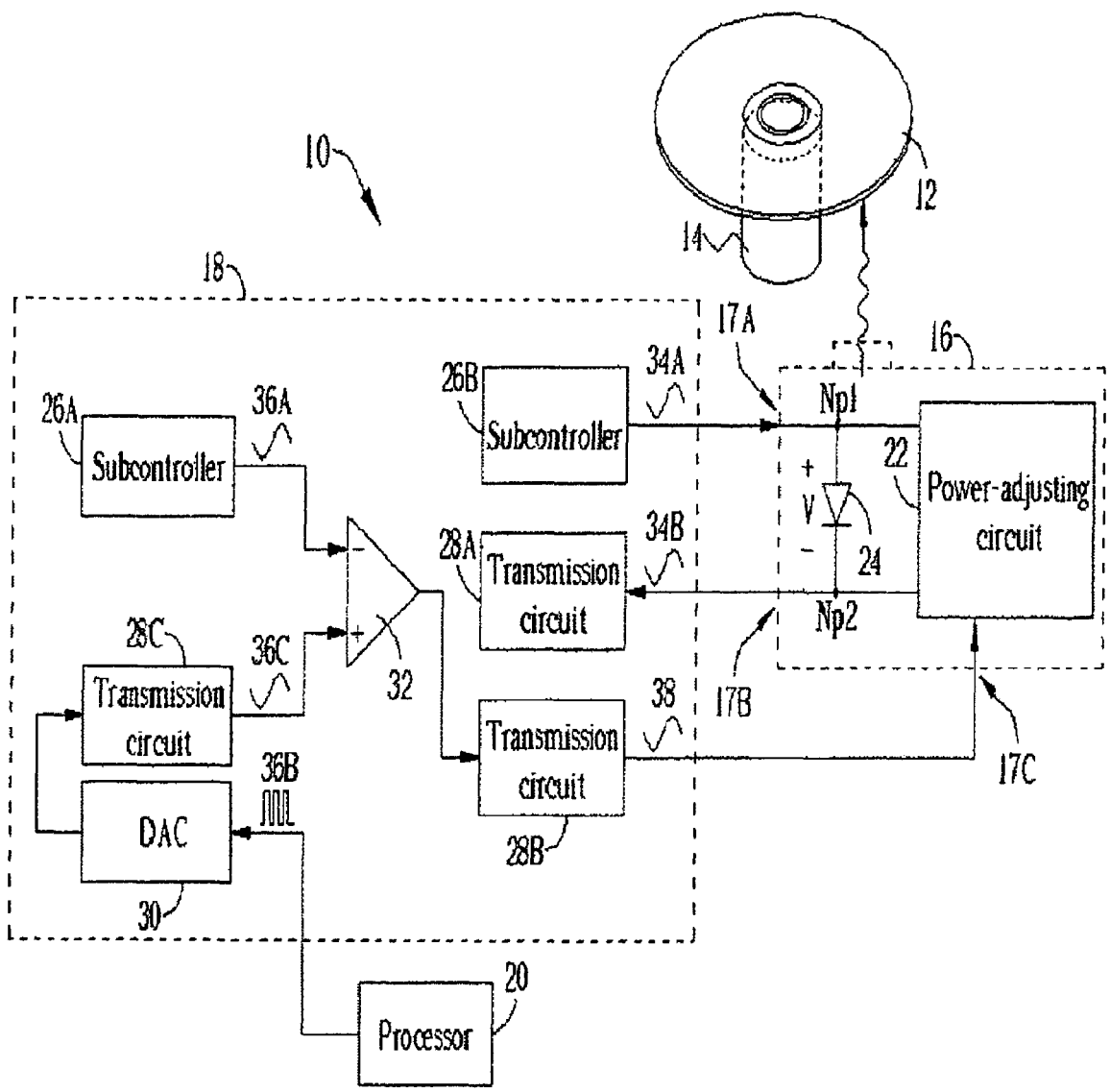
FIG. 1 is a function block diagram of an optical disk drive according to the prior art.
Figure 2:
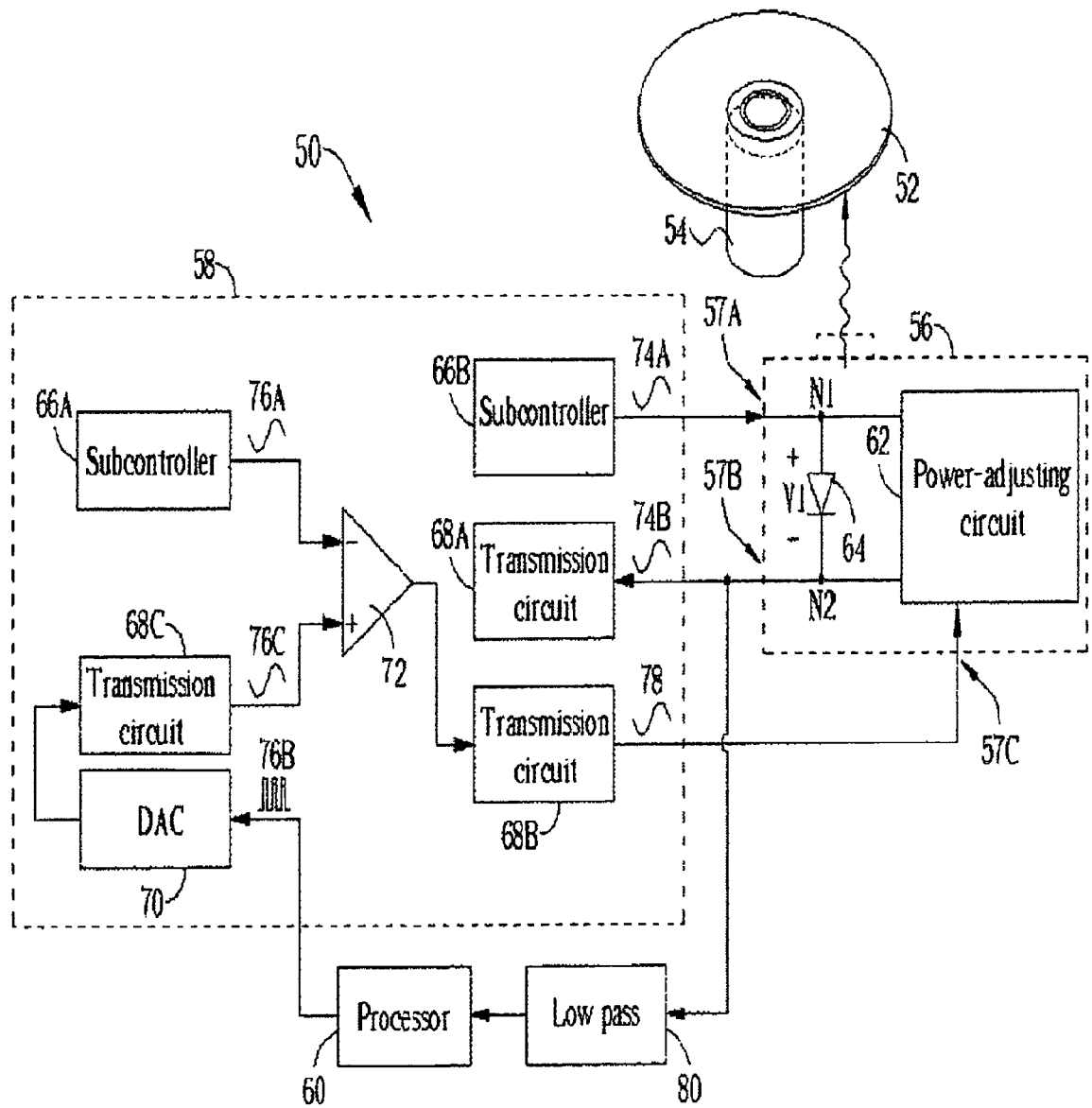
FIG. 2 is a function block diagram of a first embodiment applied to an optical disk drive according to the present invention.
Figure 3:
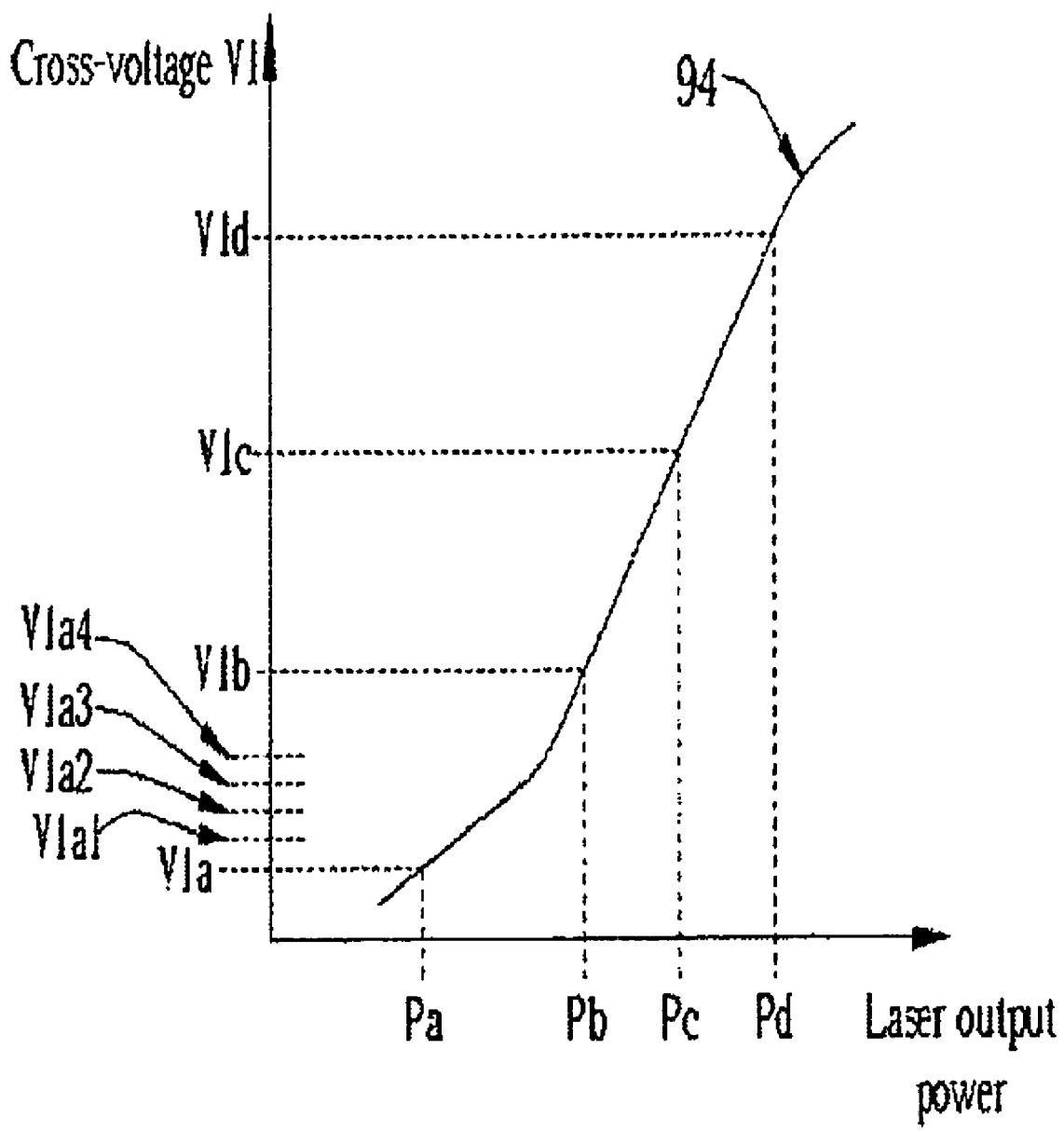
FIG. 3 is a diagram of a function of laser output powers of a pickup head and cross-voltages of a laser diode of the optical disk drive shown in FIG. 2.

Please refer to FIG. 2, which is a function block diagram of a first embodiment applied to an optical disk drive 50 according to the present invention. Similar to the optical disk drive 10, the optical disk drive 50 also comprises a motor 54 for rotating a disk 52, a pickup head 56 capable of emitting laser beams, a control circuit 58 for generating a control signal 78 to adjust powers of laser beams emitted by the pickup head 56, and a processor 60 for controlling functionalities of the optical disk drive 50. The processor 60 changes the control signal 78 generated by the control circuit 58 with a second signal 76B and controls powers of laser beams emitted by the pickup head 56 with the control signal 78. The structure of the optical disk drive 50 is similar to that of the optical disk drive 10. That is, the control circuit 58 also comprises three transmission circuits 68A, 68B and 68C for transmitting signals, two sub-controllers 66A and 66B for respectively generating a constant first signal 76A and a constant bias voltage 74A. A DAC 70 transforms the digital second signal 76B into an analog second signal 76C. The transmission circuit 68C transmits the analog second signal 76C to a differential circuit 72 and the differential circuit 72 generates the control signal 78 according to difference between the analog second signal 76C and the first signal 76A. A laser diode 64, installed in the pickup head 56 and serving as a laser generator, generates the laser beams to project onto the disk 52. A power-adjusting circuit 62 receives the bias voltage 74A with a reference end 57A and adjusts a cross-voltage V1 across two ends of the laser diode at nodes N1 and N2 according to the control signal 78. A cross-voltage output end 57B outputs the voltage at node N2 to the transmission circuit 68a of the control circuit 58. A VT3190 chip, which is produced by VIA technology, Inc., adjusts laser output powers according to a direct proportional relation between difference of two voltages FVREF and FPDOLPF and the laser output powers. So the comparison between difference of FVREF and FPDOLPF with the first signal can serve as a reference to adjust the cross-voltage.

Where the present invention differs from the prior art is the processor 60 is capable of controlling the laser output powers of the pickup head 56 in a feedback manner by determining an output voltage 74B to compensate the drifting effect of the laser output power due to variations of the pickup head and the control circuit. Principles of feeding back for the present invention are described as follows: Please refer to FIG. 3, as well as to FIG. 2. A curve 94 shown in FIG. 3 demonstrates a relation of the laser output power of the pickup head 56 and the cross-voltage V1, an abscissa indicating power levels of the laser output power and an ordinate voltage levels of the cross-voltage V1. When the cross-voltage V1 is changed by the power-adjusting circuit 62 according to the control signal 78, because a voltage difference across two ends of the laser diode 64 is determined according to the cross-voltage V1, the powers of laser beams emitted by the laser diode 64 change accordingly. That is, as the power-adjusting circuit 62 raises the cross-voltage V1 from voltage levels V1a, V1b to voltage levels V1c, V1d gradually, the laser output power of the pickup head 56 is raised from power levels Pa, Pb to power levels Pc, Pd (as indicated in FIG. 3) accordingly. In general, the laser output power of a pickup head varies within an ideal range. That is, the power level of laser signals reflected from a disk is ideal as long as the laser output power of the pickup head falls in the ideal range, thus effectively providing complete information of the disk and controlling the rotating speed for the motor and other functions, like track-locking and track-searching functions, by determining the reflected laser signals correctly. When operated within the ideal range, the pickup head enables the laser output power of the pickup head and the cross-voltage perform well linear relation with corresponding circuits. As shown in FIG. 3, a range from the power level Pb and Pb indicates the ideal range of the laser output power. Part of the curve 94 within the range is perfectly linear, the difference between the power levels Pc and Pb being approximately proportional to the difference between the voltage levels V1c and V1b. Consequently, an ideal range for the cross-voltage V1 can be defined by the help of the ideal range for the laser output power and the curve 94. That the cross-voltage V1 falls into the ideal range indicates the laser output power is falling within the ideal range as well.

According to the above-mentioned principles, the processor 60 is capable of controlling the second signal 76B in the feedback manner by determining the voltage levels of the cross-voltage V1 and of changing the control signal 78 with the control circuit 58 to enable the power-adjusting circuit 62 to update the cross-voltage V1. After fed back by the updated cross-voltage V1, the processor 60 continues changing the control signal 78 with the second signal 76B, enabling the power-adjusting circuit 62 to adjust the cross-voltage V1 again. The steps described above can be processed continuously until the processor 60 has determined that the cross-voltage V1 enters the ideal range. For example, if the cross-voltage V1 equals the voltage level V1$a$, which is smaller than the voltage level V1$b$ of the ideal range, as the processor 60 receives the voltage level V1$a$ for the feedback control, the processor 60 will change the second signal 76B and enables the control circuit 58 to generate a new control signal 78, which is greater than the old control signal 78, with the second signal 76$c$, which is greater than the second signal 76B. If it is assumed that a control pattern for the power-adjusting circuit 62 is a large cross-voltage V1 corresponding to a large control signal 78, the power-adjusting circuit 72 can, therefore, raise the cross-voltage V1 with the enlarged control signal 78. The enlarged cross-voltage V1 will be fed back to the processor 60 and the processor 60 can then determine whether to further raise the cross-voltage V1 with the control circuit 58 and power-adjusting circuit 62.

Practically, since the voltage level of the cross-voltage V1 at node N1 will be kept at a constant level by the bias voltage 74A, the processor 60 can only depend on the output voltage 74B output from the cross-voltage output end 57B at node N2, as well as the cross-voltage V1 equivalently, to process the feedback control according to the present invention. A low pass filter can be used to filter high frequency components in the cross-voltage V1, as well as high frequency noises, to prevent related circuits from being damaged by the cross-voltage V1 due to abrupt variation of voltages during the feedback controlling process. In FIG. 2, a low pass filter 80, installed in the optical disk drive 50, is used to filter out the high frequency components and to moderate the variation of the output voltage 74B during the feedback controlling process. Furthermore, a way to gradually raise the cross-voltage from a lower voltage level to a voltage level within the ideal range is used to prevent the laser diode 64 from damage due to too large a cross-voltage. For example, referring to FIG. 3 again, the processor 60 can raise the cross-voltage V1 by iterating the process of feedback-and-adjusting with the control circuit 58 and the power-adjusting circuit 62 from the voltage level V1$a$ to a voltage level with the ideal range gradually through voltage levels V1$a$1, V1$a$2, V1$a$3 and V1$a$4. The pattern of how the power-adjusting circuit adjusts the cross-voltage according to the control signal is slightly different from one power-adjusting circuit to another due to the variations of the power-adjusting circuits, so gradually raising the cross-voltage V1 prevents the laser diode from damage due to the abrupt variation of the cross-voltage V1.

As mentioned previously, the control circuit 58 and power-adjusting circuit 62 suffer from drifting effect due to a mass production. In other words, the control signal 78 differs even if the processor 60 controls different but same type control circuits with an identical second signal 76B. Even if utilizing an identical control signal 78, different but same type power-adjusting circuits can generate different cross-voltages V1. In the prior art, the above two drifting effects of the control circuit and power-adjusting circuit combine to become the cross-voltage for the laser diode extremely large or small, thereby shifting the laser output power away from the ideal range. In the present invention, however, the cross-voltage V1 can be kept at a voltage level within the ideal range by updating the control signal 78 and iteratively adjusting the cross-voltage V1 according to the voltage level of the cross-voltage V1. Since the processor 60 adjusts the control signal 78 by determining the cross-voltage V1, the processor 60 still can keep the cross-voltage V1 at a voltage level within the ideal range by iteratively adjusting the control signal 78 according to the cross-voltage V1 even if the control circuit and power-adjusting circuit both suffer from the drifting effect due to mass production. For example, after controlled by the processor 60, a control circuit can combine with a power-adjusting circuit to raise the cross-voltage V1 sequentially from the voltage level V1$a$, V1$a$1, to V1$a$2, and another control circuit, after controlled by the processor 60, can combine with another power-adjusting circuit to raise the cross-voltage V1 through another route, like from voltage level V1$a$, V1$a$2, to V1$a$4. The point is no matter what kind of circumstances are present, the processor 60 always can adjust the cross-voltage V1 to a voltage level within the ideal range and the laser output power to a power level within the ideal range as well, regardless of the drifting effects of the control circuit and power-adjusting circuit. In conclusion, the combined deviations of the control circuit 58 and power-adjusting circuit 62 can not only affect the processes, but also the results of the feedback controlling process.

Figure 4:
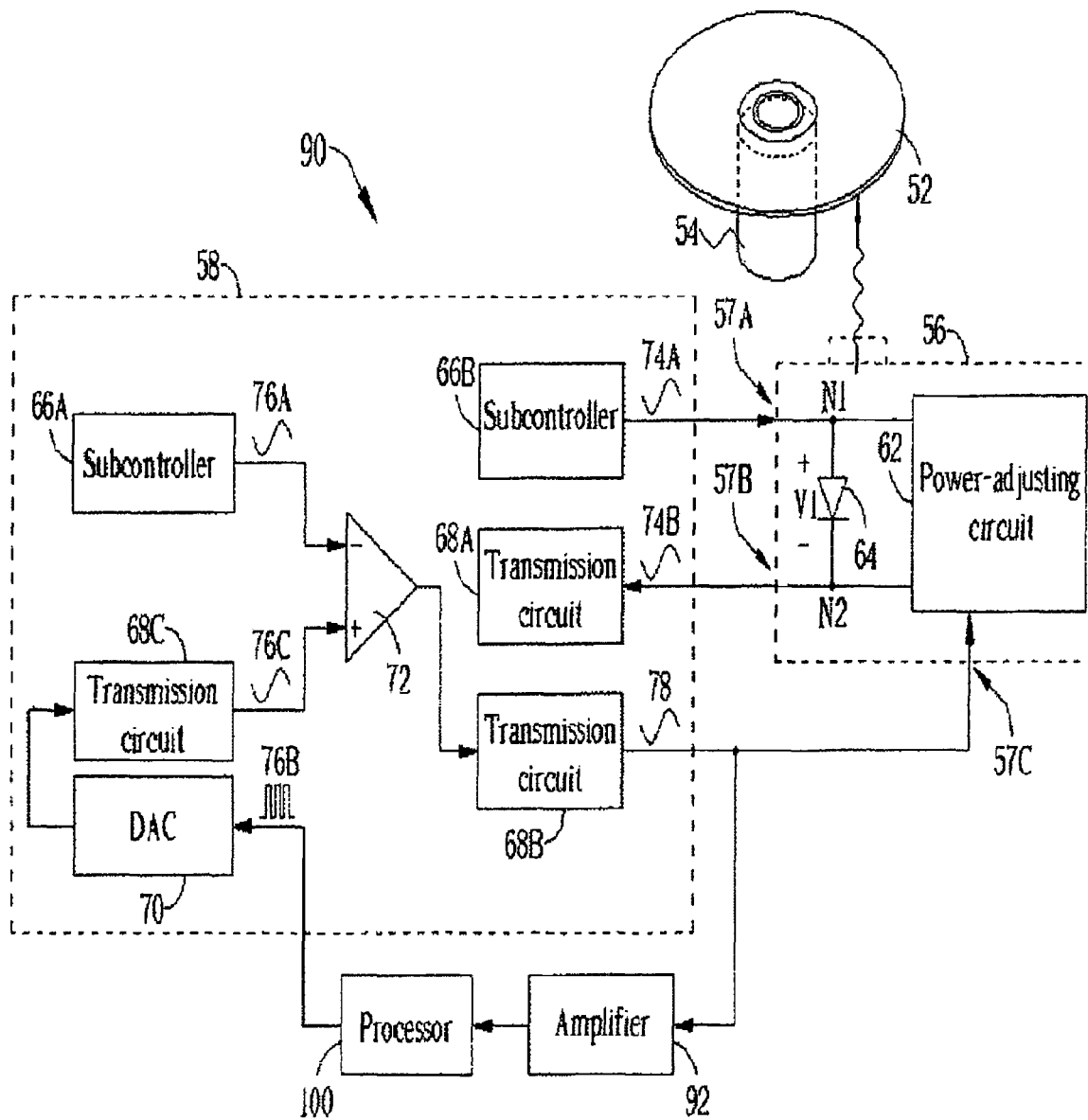
FIG. 4 is a function block diagram of a second embodiment applied to an optical disk drive according to the present invention.
Figure 5:
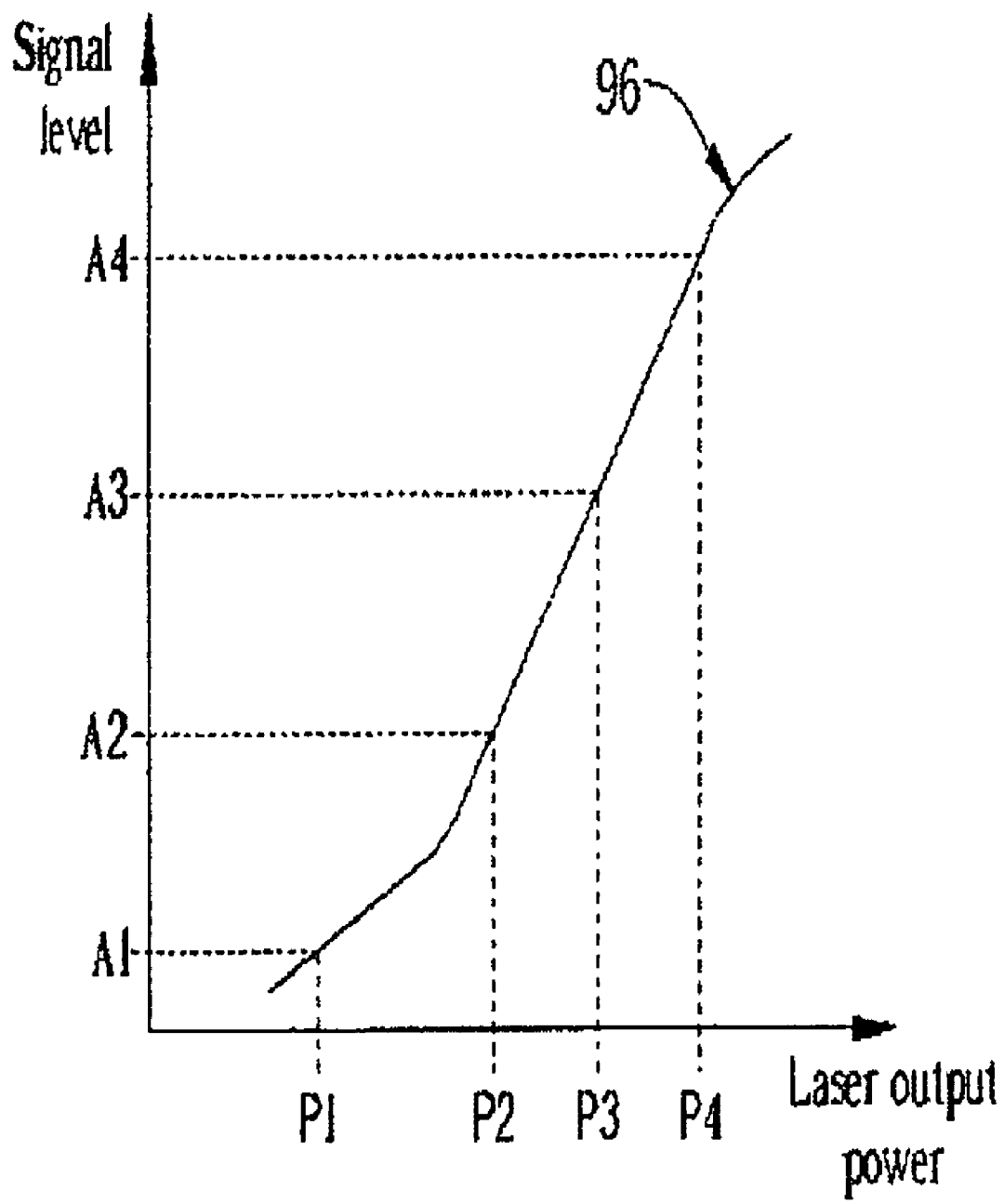
FIG. 5 is a diagram of a function of laser output powers of a pickup head and cross-voltages of a laser diode of the optical disk drive shown in FIG. 4.

Please refer to FIG. 4, which is a function block diagram of a second embodiment applied to an optical disk drive 90 according to the present invention. For simplicity, the components shown in FIG. 4 and whose index is as the same as an index of a component in FIG. 2 have an identical functionality as that of the components in FIG. 2. That is, the optical disk drive 90 comprises the control circuit 58 and the pickup head 56, the processor 100 emits the second signal 76B and controls the control circuit 58 to generate the corresponding control signal 78, and the power-adjusting circuit 62 adjusts the cross-voltage V1 according to the control signal 78. Where the second embodiment differs from the first embodiment is the processor 100 of the optical disk drive 90 adjusts the second signal 76B to updates the control signal 78 and changes the cross-voltage V1 with the power-adjusting circuit 62. Please refer to FIG. 5, as well as to FIG. 4. A curve 96 shown in FIG. 5 demonstrates a relation between the laser output power of the pickup head 56 and the control signal 78, an abscissa indicating the levels of the laser output power of the pickup head 56 and an ordinate the levels of the control signal 78. As the control signal 78 received by the power-adjusting circuit 62 is raised from a voltage level A1 to A4, the laser output power of the pickup head 56 will raise from a power level P2 to P4 accordingly. In the curve 96, a laser output power can be defined with the power levels P2 and P4. Similarly to the curve 94 shown in FIG. 3, part of the curve 96 within the power levels P2 and P4 performs a perfect linear characteristic and defines a corresponding ideal range for the control signal 78 from the voltage level A2 to A4. That the control signal 78 enters the corresponding ideal range represents the laser output power being falling into the ideal range too. The principle described above shows that the processor 100 can be controlled by the control signal 78 in the feedback manner and the processor 100 can adjust the second signal 76$b$ according to the second signal 76B and controls the control circuit 58 to update the second signal 76B and to correspond the second signal 76B with the ideal range.

Practically, the optical disk drive 90 can utilize an amplifier 92 to amplify the control signal 78 so that the processor 100 can easily generate the corresponding second signal 76B (indicating the current power level of the pickup head 56) and feed the second signal 76B to the differential amplifier 72 for a further comparison operation between the first signal 76A and analog second 76C. Similar to the operations of the first embodiment, by iterating the feedback-and-adjusting steps, the processor 100 of the second embodiment can gradually raise the second signal 76B from a smaller voltage level, like the voltage level A1 shown in FIG. 5, and then determines whether the control signal 78 has fallen into the ideal range according to the feedback control signal 78. If not so, the processor 100 continues raising the control signal 78 with the control circuit 58 by further adjusting the second signal 76B until the control signal 78 enters into the ideal range. Similar to the first embodiment, the second embodiment shown in FIG. 4 also can overcome the drifting effect of the control circuit 58. That is, even if the control signals generated by the control circuit 58 after receiving an identical second signal 76B are different, because the processor 100 is controlled in the feedback manner according to the control signal 78, the control signal 78 can still be control to stay at a voltage level within the ideal range and the laser output power will stay at a power level within the ideal range, becoming neither too large nor small.

In an optical disk drive, a processor controls the laser output power of a pickup head with a control circuit and a power-adjusting circuit. According to the prior art, the drifting effect of the control circuit and power-adjusting circuit combine to enable the laser output power of the pickup head out of control and to become extremely large or small, resulting in too large or too small laser signals reflected by a disk projected by laser beams having unstable power and some functions, like track-locking, track-searching or rotating speed control of the optical disk drive, functioning according to stable reflected laser signals are hard to perform. In contrast to the prior art, the present invention can provide an optical disk drive to keep the laser output power of pickup head at a power level within the ideal range according to the control signal of the power-adjusting circuit and the cross-voltage of the laser diode. Therefore, the laser signal reflected by the disk has a moderate voltage level and the optical disk drive can perform the functions of track-locking, track-searching and rotating speed control normally according to the reflected laser signal. Additionally, the optical disk drive can achieve the above goals without changing the design of the control circuit and pickup head, reducing the bulk and cost to design the optical disk drive.

Following the detailed description of the present invention above, those skilled in the art will readily observe that numerous modifications and alterations of the device may be made while retaining the teachings of the invention. Accordingly, the above disclosure should be construed as limited only by the metes and bounds of the appended claims.

The invention claimed is:

1. A method for adjusting powers of laser beams emitted by a pickup head of an optical disk drive, the pickup head comprising:
    a laser generator for generating laser beams projected onto a disk placed on the optical disk drive according to a cross-voltage, the powers of the laser beams generated by the laser generator varying with the cross-voltage;
    a control end for receiving a control signal to adjust the cross-voltage such that the cross-voltage changes according to the control signal;
    a reference signal end for receiving a bias voltage; and
    a cross-voltage output end for outputting an output voltage, the output voltage corresponding to differences between the bias voltage and the cross-voltage; and
    the method comprising changing the control signal according to the level of the output voltage.

2. The method of claim 1, wherein the bias voltage is kept at a constant level.

3. The method of claim 2 further comprising:
    filtering the output voltage with a low pass filter;
    wherein the step of changing the control signal according to the level of the output voltage changes the control signal according to the filtered output voltage.

4. The method of claim 1, wherein the optical disk drive generates the control signal according to a first signal and a second signal, the second signal being changed according to the level of the output voltage when executing the step of changing the control signal according to the level of the output voltage, thus changing the differences between the first signal and second signal, the first signal indicating powers of laser beams for the optical disk drive during a recording process, and the second signal being generated along with the output voltage.

5. The method of claim 4, wherein the optical disk drive further comprises:
    a digital to analog convener for transforming the second signal into an analog signal, the optical disk drive generating the control signal according to the differences between the first signal and the analog second signal when the optical disk drive generates the control signal according to the differences between the first signal and second signal.

6. A controller for an optical disk drive, the controller being used to adjust powers of laser beams emitted by a pickup head or the optical disk drive, the pickup head comprising:
    a laser generator for generating laser beams projected onto a disk placed on the optical disk drive according to a cross-voltage, the powers of the laser beams generated by the laser generator varying with the cross-voltage;
    a control end for receiving a control signal to adjust the cross-voltage such that the cross-voltage changes according to the control signal;
    a reference signal end for receiving a bias voltage; and
    a cross-voltage output end for outputting an output voltage, the output voltage corresponding to differences between the bias voltage and the cross-voltage, and the controller capable of changing the control signal according to the level of the output voltage.

7. The controller of claim 6, wherein the controller keeps the bias voltage at a constant level.

8. The controller of claim 7, wherein the optical disk drive further comprises a low pass filter for filtering the output voltage, and the controller changes the control signal according to the filtered output voltage when the controller changes the control signal according to the level of the output voltage.

9. The controller of claim 6 generating the control signal according to differences between a first signal and a second signal, the second signal being changed according to the level of the output voltage when the controller changes the control signal according to the level of the output voltage, thus changing the differences between the first signal and second signal, the first signal indicating powers of laser beams for the optical disk drive during a recording process, and the second signal being generated along with the output voltage.

10. The controller of claim 9 further comprising a digital to analog converter for transforming the second signal into an analog signal, the controller changing the second signal according to differences between the analog second signal and the first signal when cue controller generates the control signal according to the differences between the first signal and second signal.

11. A method for adjusting powers of laser beams emitted by a pickup head of an electra-optical system, the method comprising:

projecting a laser beam onto a disk according to a cross-voltage, a power of the laser beam varying with the cross-voltage;

feeding back the cross-voltage for comparing with a target voltage to generate a difference value; and adjusting a level of the cross-voltage according to the difference value to change the powers of the laser beams emitted by the pickup head.

12. The method of claim 11, wherein the laser beam has a constant power.

13. The method of claim 11, wherein the difference value is used to change a level of a control signal, the control signal corresponding to the level of the cross-voltage, such that the level of the cross-voltage varies with the level of the control signal.

14. The method of claim 13 further comprising:

filtering the cross-voltage to get rid of high frequency components in the cross-voltage; and changing the control signal according to the filtered cross-voltage.

15. The method of claim 13, wherein the cross-voltage equals to a difference between an output voltage and a reference voltage.

16. The method of claim 13, wherein a level of the reference voltage is constant.

17. The method of claim 11 further comprising:

transforming the cross-voltage into an analog cross-voltage before the step of generating the difference value.

* * * * *